United States Patent
Lee et al.

(10) Patent No.: US 11,586,109 B2
(45) Date of Patent: Feb. 21, 2023

(54) CHEMICALLY-AMPLIFIED-TYPE NEGATIVE-TYPE PHOTORESIST COMPOSITION

(71) Applicant: YOUNG CHANG CHEMICAL CO., LTD, Gyeongsangbuk-do (KR)

(72) Inventors: Seung Hun Lee, Daegu (KR); Seung Hyun Lee, Daegu (KR); Su Jin Lee, Daegu (KR); Young Cheol Choi, Gumi-si (KR)

(73) Assignee: YOUNG CHANG CHEMICAL CO., LTD, Seongju-Gun Gyeongsangbuk-do (KR)

( * ) Notice: Subject to any disclaimer, the term of this patent is extended or adjusted under 35 U.S.C. 154(b) by 55 days.

(21) Appl. No.: 16/098,706

(22) PCT Filed: Apr. 26, 2017

(86) PCT No.: PCT/KR2017/004451
§ 371 (c)(1),
(2) Date: Nov. 2, 2018

(87) PCT Pub. No.: WO2017/196010
PCT Pub. Date: Nov. 16, 2017

(65) Prior Publication Data
US 2019/0137871 A1   May 9, 2019

(30) Foreign Application Priority Data

May 13, 2016 (KR) .................. 10-2016-0058744

(51) Int. Cl.
*G03F 7/038*      (2006.01)
*G03F 7/004*      (2006.01)
*G03F 7/30*       (2006.01)

(52) U.S. Cl.
CPC .......... *G03F 7/0382* (2013.01); *G03F 7/0048* (2013.01)

(58) Field of Classification Search
CPC ............................ G03F 7/0048; G03F 7/0382
See application file for complete search history.

(56) References Cited

U.S. PATENT DOCUMENTS

| | | | | |
|---|---|---|---|---|
| 5,908,730 A | * | 6/1999 | Nitta | G03F 7/0045 430/170 |
| 2003/0039921 A1 | * | 2/2003 | Washio | G03F 7/0045 430/270.1 |
| 2003/0113658 A1 | * | 6/2003 | Ebata | C07C 309/17 430/270.1 |
| 2014/0349222 A1 | * | 11/2014 | Shibui | C08G 8/22 430/18 |
| 2015/0010855 A1 | * | 1/2015 | Tsuchimura | C08F 12/26 430/5 |
| 2015/0072274 A1 | * | 3/2015 | Tsuchimura | G03F 7/30 430/5 |
| 2015/0362836 A1 | * | 12/2015 | Tsuchimura | G03F 7/0387 430/270.1 |

FOREIGN PATENT DOCUMENTS

| | | |
|---|---|---|
| EP | 1666972 A1 | 6/2006 |
| JP | 11-015158 A | 1/1999 |
| JP | 2015-036774 A | 2/2015 |
| KR | 10-0266276 B1 | 9/2000 |
| KR | 10-2001-0051692 A | 6/2001 |
| KR | 10-2008-0088508 A | 10/2008 |
| KR | 10-2015-0024267 A | 3/2015 |
| KR | 10-2015-0026996 A | 3/2015 |
| KR | 10-2015-0047433 A | 5/2015 |
| KR | 10-2015-0067236 A | 6/2015 |
| KR | 10-1615980 B1 | 4/2016 |

* cited by examiner

*Primary Examiner* — John S Chu
(74) *Attorney, Agent, or Firm* — Novick, Kim & Lee PLLC; Jae Youn Kim

(57) ABSTRACT

The present invention relates to a chemically-amplified-type negative photoresist composition, and more particularly to a chemically-amplified-type negative photoresist composition suitable for use in a semiconductor process, which includes a specific organic acid additive, thereby improving a processing margin in a short-wavelength exposure light source compared to conventional negative photoresists.

5 Claims, 1 Drawing Sheet

CHEMICALLY-AMPLIFIED-TYPE NEGATIVE-TYPE PHOTORESIST COMPOSITION

TECHNICAL FIELD

The present invention relates to a chemically-amplified-type negative photoresist composition, which is able to improve a processing margin when using a short-wavelength exposure light source.

BACKGROUND ART

With the recent demand to reduce the size and increase the degree of integration of semiconductor devices through the development of semiconductor manufacturing technology, techniques for forming ultrafine patterns having line widths corresponding to tens of nm or less are required. Advances in techniques for forming ultrafine patterns have been made through the use of light sources having smaller wavelengths and through the development of processing technology and photoresists suitable for such light sources.

A photoresist is used for photolithography for forming a variety of patterns. The term "photoresist" refers to a photosensitive resin, the solubility of which varies in a developing solution due to the action of light, to thus obtain an image corresponding to the exposure pattern.

The formation of a photoresist pattern includes negative tone development (NTD) using a negative tone developing solution and positive tone development (PTD) using a positive tone developing solution.

The process of forming a pattern through NTD includes selectively dissolving and removing an unexposed region using a negative tone developing solution, and the process of forming a pattern through PTD includes selectively dissolving and removing an exposed region using a positive tone developing solution.

Compared to pattern formation using PTD, pattern formation using NTD enables the formation of a reverse-phase pattern in a contact-hole pattern or a trench pattern, which is considered to be difficult to form due to insufficient exposure, thereby making it easy to consistently form a pattern. Furthermore, an organic solvent is used as the developing solution for removing the unexposed portion, thereby more effectively forming a photoresist pattern.

Meanwhile, a typical photolithography process using a photoresist composition includes coating a wafer with a photoresist, performing soft baking for heating the coated photoresist to evaporate the solvent, forming an image by means of a light source passed through a photomask, forming a pattern through a difference in solubility between an exposed portion and an unexposed portion using a developing solution, and completing a circuit through etching.

The photoresist composition may be exemplified by a composition composed of a photosensitive agent (a photoacid generator) for generating an acid through excimer laser irradiation, a basic resin and other additives. The basic resin, configured such that a phenol structure contains a hydroxyl group, typically includes a polystyrene polymer, and any photosensitive agent may be used so long as it is able to generate an acid ($H^+$) at a specific wavelength, and main examples thereof may include sulfonium-, sulfonyl diazo-, benzo sulfonyl-, iodine-, chlorine-, and carboxylic acid-based materials.

Also, a light source mainly used for the above process has a wavelength in a range from 193 nm to 365 nm, examples of which include an I-ray, a KrF excimer laser, and an ArF excimer laser. As is known in the art, the shorter the wavelength, the finer the pattern.

In particular, thorough research into a KrF laser (a wavelength of 248 nm) photoresist for photo microprocessing is ongoing despite the development of an ArF laser (a wavelength of 193 nm) system. This is because the development of next-generation ArF photoresists is still unsatisfactory, and also because the use of a KrF photoresist may greatly reduce the cost for mass production of semiconductors. Accordingly, the performance of a KrF photoresist has to be improved in order to support such technical development, and, for example, the thickness of the photoresist is required to decrease with an increase in the degree of integration. Hence, the development of a photoresist in which dry etching resistance is further increased is urgently required. In addition thereto, there are requirements for high resolution, a wide DOF (Depth Of Focus) margin, defect-free thin film formation, adhesion to a substrate, high contrast, fast sensitivity and chemical stability.

Conventional techniques pertaining to the negative photoresist for a KrF laser include Korean Patent No. 10-0266276 ⌈Negative photoresist composition⌋, Korean Patent Application Publication No. 10-2015-0067236 ⌈Negative photosensitive resin composition⌋, Korean Patent Application Publication No. 10-2015-0047433 ⌈Salt and photoresist composition including same⌋, and Korean Patent Application Publication No. 10-2015-0026996 ⌈Compound, resin, photoresist composition, and method of forming photoresist pattern⌋.

As disclosed in the conventional patents, a photoresist for KrF is mainly composed of, as basic resin, polyhydroxystyrene and polystyrene polymers having good transmittance at a wavelength of 248 nm in order to increase resolution and sensitivity.

Thorough research has been carried out into photoresists composed of polyhydroxystyrene and polystyrene polymers from the viewpoint of improving profile, focus margin, energy margin, etc. In particular, the numerical values related to photoresist performance have already reached their limits when a light source having a wavelength of 248 nm is used. Also, the range of energy that may be applied in the process using a light source of 248 nm is limited, making it difficult to perform the process.

DISCLOSURE

Technical Problem

Accordingly, the present invention is intended to provide a chemically-amplified-type negative photoresist composition, which is able to improve a processing margin even in the presence of a short-wavelength exposure light source such as KrF by improving an energy margin through minimization of changes in pattern size depending on the exposure energy.

Technical Solution

Therefore, the present invention provides a chemically-amplified-type negative photoresist composition, comprising, based on the total weight of the composition, 0.1 to 1 wt % of at least one organic acid additive selected from among compounds represented by Chemical Formulas 1 to 4 below.

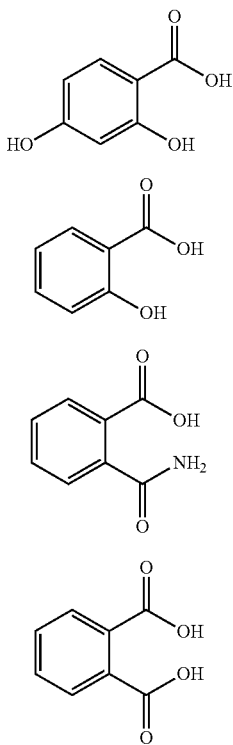

[Chemical Formula 1]

[Chemical Formula 2]

[Chemical Formula 3]

[Chemical Formula 4]

In a preferred embodiment of the present invention, the composition includes, based on the total weight of the composition, 5 to 60 wt % of a polymer resin, 0.1 to 1 wt % of the organic acid additive, 1 to 10 wt % of a crosslinking agent, 0.1 to 10 wt % of a photoacid generator, 0.01 to 5 wt % of an acid diffusion inhibitor, and the remainder of a solvent.

In a preferred embodiment of the present invention, the polymer resin is at least one selected from the group consisting of a phenol polymer resin and a cresol polymer resin, each of which has a hydroxyl group.

In a preferred embodiment of the present invention, the phenol polymer resin is a resin derived from at least one monomer selected from among 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, 2,4,6-trihydroxy benzaldehyde, and 4-vinyl phenol, and the cresol polymer resin is a resin derived from at least one cresol selected from among o-cresol, p-cresol, m-cresol, epoxy o-cresol, epoxy p-cresol, and epoxy m-cresol.

In a preferred embodiment of the present invention, the crosslinking agent is at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylol urea, tetramethoxy methyl urea, tetramethoxy ethyl urea, and tetramethoxyethyl-2,4-diamino-1,3,5-triazine.

In a preferred embodiment of the present invention, the photoacid generator is at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate, and norbornene dicarboxyimide perfluorooctane sulfonate.

In a preferred embodiment of the present invention, the acid diffusion inhibitor is at least one selected from the group consisting of dimethylamine, diethylamine, trimethylamine, triethylamine, tributylamine, dimethanolamine, diethanolamine, trimethanolamine, triethanolamine, and tributanolamine.

Advantageous Effects

According to the present invention, a chemically-amplified-type negative photoresist composition includes a specific organic acid to thereby minimize changes in pattern size depending on the exposure energy, namely improve an energy margin, and is thus useful as a resist composition for a short-wavelength exposure light source such as KrF, and is improved in a processing margin.

BEST MODE

Figure 1:
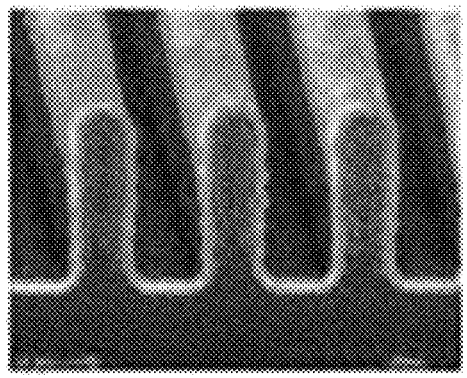
FIGS. 1 to 3 are FE-SEM (Field Emission Scanning Electron Microscopy) images of patterns of Comparative Example and Examples 1 and 5 (magnification: 100K).

Unless otherwise defined, all the technical and scientific terms used herein have the same meanings as those typically understood by those skilled in the art to which the present invention belongs. Generally, the nomenclature used herein is well known in the art and is typical.

As used herein, when any part "includes" any element, this does not mean that other elements are excluded, and such other elements may be further included unless otherwise specifically mentioned.

As used herein, the term "photoresist" refers to a composition comprising a polymer and a photosensitive agent, the chemical properties of which change upon radiation of light thereto, thus altering the solubility thereof in a specific solvent when exposed to light of any wavelength, and thus an undissolved portion is left behind to thus form a pattern after the duration of a certain dissolution time due to the difference in dissolution rate between an exposed portion and an unexposed portion for the solvent.

As used herein, the term "photolithography" means that, when a mask having a semiconductor circuit design is disposed between a light source and a photoresist layer applied on a silicon wafer and the light source is turned on, the circuit of the mask is transferred onto the photoresist using the properties of the photoresist.

As used herein, the term "KrF" or "KrF laser" refers to a krypton fluoride (KrF) laser having a wavelength of 248 nm.

An embodiment of the present invention pertains to a chemically-amplified-type negative photoresist composition, comprising at least one organic acid additive selected from among compounds represented by Chemical Formulas 1 to 4 below.

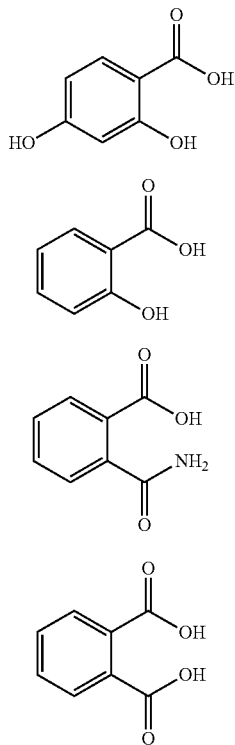

[Chemical Formula 1]

[Chemical Formula 2]

[Chemical Formula 3]

[Chemical Formula 4]

When at least one compound selected from among compounds represented by Chemical Formulas 1 to 4 is added as the organic acid additive, the amount thereof is preferably 0.1 to 1 wt % based on the total weight of the composition.

If the amount of the compound is less than 0.1 wt % based on the total weight of the composition, the amount of the organic acid additive is too small and thus energy margin improvement effects are insignificant. On the other hand, if the amount thereof exceeds 1 wt %, resolution may decrease and pattern footing may occur, undesirably causing defective profiles having poorly formed rectangles.

Among the compounds represented by Chemical Formulas 1 to 4, the compounds represented by Chemical Formulas 1 and 4 are more preferable from the viewpoint of improving an energy margin, and the compound represented by Chemical Formula 1 is most preferable.

In a specific embodiment of the present invention, the chemically-amplified-type negative photoresist composition may include, based on the total weight of the composition, 5 to 60 wt % of a polymer resin, 0.1 to 1 wt % of at least one organic acid additive selected from among compounds represented by Chemical Formulas 1 to 4, 1 to 10 wt % of a crosslinking agent, 0.1 to 10 wt % of a photoacid generator, 0.01 to 5 wt % of an acid diffusion inhibitor, and the remainder of a solvent.

The polymer resin may be at least one selected from the group consisting of a phenol polymer resin and a cresol polymer resin, each of which has a hydroxyl group.

More specifically, the phenol polymer resin may be a resin derived from at least one monomer selected from among 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, 2,4,6-trihydroxy benzaldehyde, and 4-vinyl phenol, and the cresol polymer resin may be a resin derived from at least one cresol selected from among o-cresol, p-cresol, m-cresol, epoxy o-cresol, epoxy p-cresol, and epoxy m-cresol, having a hydroxyl group.

The polymer resin is preferably contained in an amount of 5 to 60 wt % based on the total weight of the composition. Given the above amount range, patterning and development are possible using appropriate exposure energy and a uniform pattern may be formed, thus minimizing residue generation.

The polymer resin has a weight average molecular weight ranging from 3,000 to 20,000 in order to realize a vertical profile.

The crosslinking agent may include at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylol urea, tetramethoxy methyl urea, tetramethoxy ethyl urea, and tetramethoxyethyl-2,4-diamino-1,3,5-triazine.

The crosslinking agent is preferably contained in an amount of 1 to 10 wt % based on the total weight of the composition. Given the above amount range, a ratio of remaining film suitable for pattern formation may be exhibited, and defects due to bridging between patterns may be minimized through appropriate crosslinking.

The photoacid generator may include at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate, and norbornene dicarboxyimide perfluorooctane sulfonate.

The photoacid generator is preferably contained in an amount of 0.1 to 10 wt % based on the total weight of the composition. Given the above amount range, crosslinking density suitable for pattern formation may be exhibited, and it is possible to prevent pattern defects in which the wall or edge of the pattern may deteriorate (LWR, LER) owing to excessive acid generation.

In order to improve a resist pattern shape, post-exposure stability, etc., the acid diffusion inhibitor may be added, and may include, for example, at least one selected from the group consisting of dimethylamine, diethylamine, trimethylamine, triethylamine, tributylamine, dimethanolamine, diethanolamine, trimethanolamine, triethanolamine, and tributanolamine.

The acid diffusion inhibitor is preferably contained in an amount of 0.01 to 5 wt % based on the total weight of the composition. Given the above amount range, it is possible to prevent pattern defects in which the wall or edge of the pattern may deteriorate (LWR, LER) owing to excessive acid generation, and pattern formation may become possible.

Meanwhile, in the photolithography process using the chemically-amplified-type negative photoresist composition according to the present invention, the application thickness thereof may fall in the range of 1,000 Å to 100,000 Å depending on the type and amount of solvent that is used, and may be dissolved in an amount of 10 to 90 wt % relative to the weight of the solvent, and may then be used.

Examples of the solvent may include ethyleneglycol monomethylether, ethyleneglycol monoethylether, methylcellosolve acetate, ethylcellosolve acetate, diethyleneglycol monomethylether, diethyleneglycol monoethylether, propyleneglycol methyl ether acetate, propyleneglycol propyl ether acetate, diethyleneglycol dimethylether, ethyl lactate, toluene, xylene, methylethylketone, cyclohexanone, 2-heptanone, 3-heptanone, and 4-heptanone, which may be used alone or in combination.

As described above, the chemically-amplified-type negative photoresist composition according to the present invention includes the specific organic acid additive, and is thus suitable for use in the fabrication of a semiconductor, thereby providing a good processing margin.

Mode for Invention

EXAMPLES

A better understanding of the present invention may be obtained through the following examples, which are set forth to illustrate, but are not to be construed as limiting the scope of the present invention, as is apparent to those skilled in the art.

Example 1

945.1 g of a negative photoresist composition was prepared by mixing 80 g of a 4-vinyl phenol monomer-derived phenol polymer resin having a weight average molecular weight of 5,000 serving as a basic resin, 0.5 g (0.05 wt %) of an organic acid additive represented by Chemical Formula 1, 4 g of triphenylsulfonium nonaflate serving as a photoacid generator, 10 g of tetramethoxymethyl glycoluril serving as a crosslinking agent, 0.6 g of tributylamine serving as an acid diffusion inhibitor, and a solvent mixture comprising 150 g of ethyl lactate and 700 g of propyleneglycol methyl ether acetate. The prepared composition was filtered using a 0.1 μm Teflon syringe filter, applied on a silicon wafer using a spin coater, and soft-baked at 100° C. for 90 sec, after which a desired thickness of 500 nm was confirmed. An exposure process was performed under a light source of 248 nm. After completion of the exposure process, a baking process at 110° C. for 90 sec and a development process using 2.38% tetramethylammonium hydroxide were carried out to thus form a pattern. The pattern thus formed was confirmed to have a sensitivity of 42 mJ/cm$^2$, a line/space resolution of 0.18 μm, and an energy margin of 9.72 nm, which is the change in pattern size for a given amount of exposure energy (mJ).

Example 2

The same procedures as in Example 1 were performed, with the exception that 945.6 g of a negative photoresist composition was prepared using 1 g (0.10 wt %) of the organic acid additive represented by Chemical Formula 1. The resultant pattern was confirmed to have a sensitivity of 43 mJ/cm$^2$, a line/space resolution of 0.18 μm, and an energy margin of 7.72 nm, which is the change in pattern size for a given amount of exposure energy (mJ).

Example 3

The same procedures as in Example 1 were performed, with the exception that 949.6 g of a negative photoresist composition was prepared using 5.0 g (0.50 wt %) of the organic acid additive represented by Chemical Formula 1. The resultant pattern was confirmed to have a sensitivity of 44 mJ/cm$^2$, a line/space resolution of 0.18 μm, and an energy margin of 6.73 nm, which is the change in pattern size for a given amount of exposure energy (mJ).

Example 4

The same procedures as in Example 1 were performed, with the exception that 954.6 g of a negative photoresist composition was prepared using 10.0 g (1.0 wt %) of the organic acid additive represented by Chemical Formula 1. The resultant pattern was confirmed to have a sensitivity of 47 mJ/cm$^2$, a line/space resolution of 0.18 μm, and an energy margin of 6.57 nm, which is the change in pattern size for a given amount of exposure energy (mJ).

Example 5

The same procedures as in Example 1 were performed, with the exception that 959.6 g of a negative photoresist composition was prepared using 15.0 g (1.50 wt %) of the organic acid additive represented by Chemical Formula 1. The resultant pattern was confirmed to have a sensitivity of 49 mJ/cm$^2$, a line/space resolution of 0.18 μm, and an energy margin of 5.41 nm, which is the change in pattern size for a given amount of exposure energy (mJ).

Example 6

The same procedures as in Example 1 were performed, with the exception that 945.1 g of a negative photoresist composition was prepared using 0.5 g (0.05 wt %) of the organic acid additive represented by Chemical Formula 2. The resultant pattern was confirmed to have a sensitivity of 43 mJ/cm$^2$, a line/space resolution of 0.18 μm, and an energy margin of 9.75 nm, which is the change in pattern size for a given amount of exposure energy (mJ).

Example 7

The same procedures as in Example 1 were performed, with the exception that 945.6 g of a negative photoresist composition was prepared using 1.0 g (0.10 wt %) of the organic acid additive represented by Chemical Formula 2. The resultant pattern was confirmed to have a sensitivity of 43 mJ/cm$^2$, a line/space resolution of 0.18 μm, and an energy margin of 8.91 nm, which is the change in pattern size for a given amount of exposure energy (mJ).

Example 8

The same procedures as in Example 1 were performed, with the exception that 949.6 g of a negative photoresist composition was prepared using 5.0 g (0.50 wt %) of the organic acid additive represented by Chemical Formula 2.

The resultant pattern was confirmed to have a sensitivity of 43 mJ/cm², a line/space resolution of 0.18 μm, and an energy margin of 8.77 nm, which is the change in pattern size for a given amount of exposure energy (mJ).

Example 9

The same procedures as in Example 1 were performed, with the exception that 954.6 g of a negative photoresist composition was prepared using 10.0 g (1.0 wt %) of the organic acid additive represented by Chemical Formula 2. The resultant pattern was confirmed to have a sensitivity of 44 mJ/cm², a line/space resolution of 0.18 μm, and an energy margin of 7.02 nm, which is the change in pattern size for a given amount of exposure energy (mJ).

Example 10

The same procedures as in Example 1 were performed, with the exception that 959.6 g of a negative photoresist composition was prepared using 15.0 g (1.50 wt %) of the organic acid additive represented by Chemical Formula 2. The resultant pattern was confirmed to have a sensitivity of 47 mJ/cm², a line/space resolution of 0.15 μm, and an energy margin of 5.91 nm, which is the change in pattern size for a given amount of exposure energy (mJ).

Example 11

The same procedures as in Example 1 were performed, with the exception that 945.1 g of a negative photoresist composition was prepared using 0.5 g (0.05 wt %) of the organic acid additive represented by Chemical Formula 3. The resultant pattern was confirmed to have a sensitivity of 44 mJ/cm², a line/space resolution of 0.18 μm, and an energy margin of 9.73 nm, which is the change in pattern size for a given amount of exposure energy (mJ).

Example 12

The same procedures as in Example 1 were performed, with the exception that 945.6 g of a negative photoresist composition was prepared using 1.0 g (0.10 wt %) of the organic acid additive represented by Chemical Formula 3. The resultant pattern was confirmed to have a sensitivity of 45 mJ/cm², a line/space resolution of 0.18 μm, and an energy margin of 8.33 nm, which is the change in pattern size for a given amount of exposure energy (mJ).

Example 13

The same procedures as in Example 1 were performed, with the exception that 949.6 g of a negative photoresist composition was prepared using 5.0 g (0.50 wt %) of the organic acid additive represented by Chemical Formula 3. The resultant pattern was confirmed to have a sensitivity of 47 mJ/cm², a line/space resolution of 0.18 μm, and an energy margin of 7.37 nm, which is the change in pattern size for a given amount of exposure energy (mJ).

Example 14

The same procedures as in Example 1 were performed, with the exception that 954.6 g of a negative photoresist composition was prepared using 10.0 g (1.0 wt %) of the organic acid additive represented by Chemical Formula 3. The resultant pattern was confirmed to have a sensitivity of 49 mJ/cm², a line/space resolution of 0.18 μm, and an energy margin of 6.98 nm, which is the change in pattern size for a given amount of exposure energy (mJ).

Example 15

The same procedures as in Example 1 were performed, with the exception that 959.6 g of a negative photoresist composition was prepared using 15.0 g (1.50 wt %) of the organic acid additive represented by Chemical Formula 3. The resultant pattern was confirmed to have a sensitivity of 52 mJ/cm², a line/space resolution of 0.15 μm, and an energy margin of 6.11 nm, which is the change in pattern size for a given amount of exposure energy (mJ).

Example 16

The same procedures as in Example 1 were performed, with the exception that 945.1 g of a negative photoresist composition was prepared using 0.5 g (0.05 wt %) of the organic acid additive represented by Chemical Formula 4. The resultant pattern was confirmed to have a sensitivity of 43 mJ/cm², a line/space resolution of 0.18 μm, and an energy margin of 9.71 nm, which is the change in pattern size for a given amount of exposure energy (mJ).

Example 17

The same procedures as in Example 1 were performed, with the exception that 945.6 g of a negative photoresist composition was prepared using 1.0 g (0.10 wt %) of the organic acid additive represented by Chemical Formula 4. The resultant pattern was confirmed to have a sensitivity of 45 mJ/cm², a line/space resolution of 0.18 μm, and an energy margin of 8.19 nm, which is the change in pattern size for a given amount of exposure energy (mJ).

Example 18

The same procedures as in Example 1 were performed, with the exception that 949.6 g of a negative photoresist composition was prepared using 5.0 g (0.50 wt %) of the organic acid additive represented by Chemical Formula 4. The resultant pattern was confirmed to have a sensitivity of 45 mJ/cm², a line/space resolution of 0.18 μm, and an energy margin of 7.13 nm, which is the change in pattern size for a given amount of exposure energy (mJ).

Example 19

The same procedures as in Example 1 were performed, with the exception that 954.6 g of a negative photoresist composition was prepared using 1.0 g (0.10 wt %) of the organic acid additive represented by Chemical Formula 4. The resultant pattern was confirmed to have a sensitivity of 47 mJ/cm², a line/space resolution of 0.18 μm, and an energy margin of 7.81 nm, which is the change in pattern size for a given amount of exposure energy (mJ).

Example 20

The same procedures as in Example 1 were performed, with the exception that 959.6 g of a negative photoresist composition was prepared using 15.0 g (1.50 wt %) of the organic acid additive represented by Chemical Formula 4. The resultant pattern was confirmed to have a sensitivity of 50 mJ/cm², a line/space resolution of 0.20 μm, and an energy margin of 9.88 nm, which is the change in pattern size for a given amount of exposure energy (mJ).

Comparative Example 1

The same procedures as in Example 1 were performed, with the exception that the organic acid additive represented by Chemical Formulas 1 to 4 was not added. The resultant pattern was confirmed to have a sensitivity of 42 mJ/cm$^2$, a line/space resolution of 0.18 µm, and an energy margin of 9.76 nm, which is the change in pattern size per mJ.

Measurement of Properties

The properties of the chemically-amplified-type negative photoresist compositions prepared in Examples 1 to 20 and Comparative Example 1 were measured.

The resolution was determined by measuring an L/S (Line, Space) minimum line width (resolution) using a critical-dimension-scanning electron microscope (CD-SEM) for observing a pattern line width (critical dimension). Also, the energy at which it became possible to determine the minimum line width (resolution) was measured and taken as the sensitivity.

Also, the energy margin was determined as the change (nm) in pattern size for a given amount of exposure energy (mJ), and specifically, the line size was measured for a given amount of exposure energy for line/space patterns using a critical-dimension-scanning electron microscope (CD-SEM) for observing a pattern line width (critical dimension).

The measurement results are shown in Table 1 below.

Figure 2:
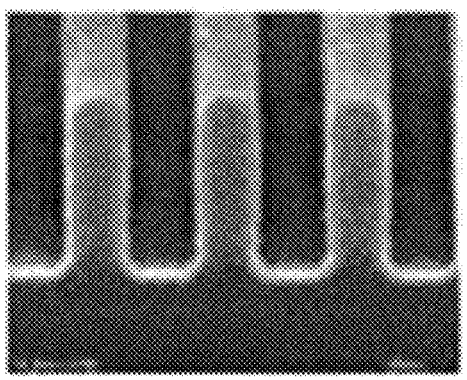
Figure 3:
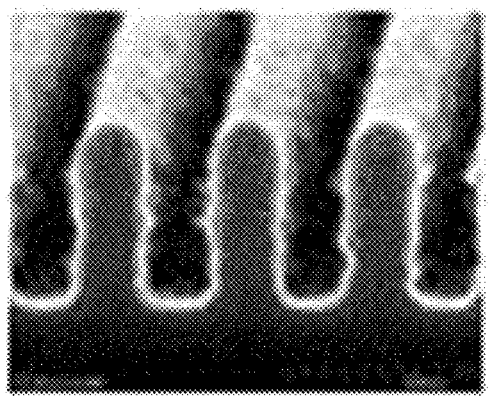

The patterns of Comparative Example and Examples 1 and 5 were observed using a FE-SEM (Field Emission Scanning Electron Microscope, available from Hitachi, Model No.: S-4700, magnification: 100K), and are shown in FIGS. 1 to 3.

TABLE 1

| No. | Kind of organic acid additive (amount, wt % based on total weight of composition) | Sensitivity (mJ/cm$^2$) | Resolution (µm) | Energy margin (nm/mJ) |
|---|---|---|---|---|
| Example 1 | Chemical Formula 1 (0.05) | 42 | 0.18 | 9.72 |
| Example 2 | Chemical Formula 1 (0.1) | 43 | 0.18 | 7.72 |
| Example 3 | Chemical Formula 1 (0.5) | 44 | 0.18 | 6.73 |
| Example 4 | Chemical Formula 1 (1.0) | 47 | 0.18 | 6.57 |
| Example 5 | Chemical Formula 1 (1.5) | 49 | 0.18 | 5.41 |
| Example 6 | Chemical Formula 2 (0.05) | 43 | 0.18 | 9.75 |
| Example 7 | Chemical Formula 2 (0.1) | 43 | 0.18 | 8.91 |
| Example 8 | Chemical Formula 2 (0.5) | 43 | 0.18 | 8.77 |
| Example 9 | Chemical Formula 2 (1.0) | 44 | 0.18 | 7.02 |
| Example 10 | Chemical Formula 2 (1.5) | 47 | 0.15 | 5.91 |
| Example 11 | Chemical Formula 3 (0.05) | 44 | 0.18 | 9.73 |
| Example 12 | Chemical Formula 3 (0.1) | 45 | 0.18 | 8.33 |
| Example 13 | Chemical Formula 3 (0.5) | 47 | 0.18 | 7.37 |
| Example 14 | Chemical Formula 3 (1.0) | 49 | 0.18 | 6.98 |
| Example 15 | Chemical Formula 3 (1.5) | 52 | 0.15 | 6.11 |
| Example 16 | Chemical Formula 4 | 43 | 0.18 | 9.71 |

TABLE 1-continued

| No. | Kind of organic acid additive (amount, wt % based on total weight of composition) | Sensitivity (mJ/cm$^2$) | Resolution (µm) | Energy margin (nm/mJ) |
|---|---|---|---|---|
| | (0.05) | | | |
| Example 17 | Chemical Formula 4 (0.1) | 45 | 0.18 | 8.19 |
| Example 18 | Chemical Formula 4 (0.5) | 45 | 0.18 | 7.13 |
| Example 19 | Chemical Formula 4 (1.0) | 47 | 0.18 | 7.81 |
| Example 20 | Chemical Formula 4 (1.5) | 50 | 0.20 | 9.88 |
| Comparative Example 1 | — | 42 | 0.18 | 9.76 |

As is apparent from Table 1, in Examples 1, 6, 11, and 16, using the organic acid additive in an amount of less than 0.1 wt %, there were almost no improvements in the resolution and energy margin compared to Comparative Example 1, indicating that the addition of the organic acid additive in an amount less than the optimal amount results in no improvement effects.

In Examples 2 to 4, 7 to 9, 12 to 14 and 17 to 19, using the organic acid additive in an optimal amount (0.1 to 1.0 wt % based on the total weight of the composition), the energy margin was improved compared to Comparative Example 1.

In Example 5, using the organic acid in an amount greater than the optimal amount, the energy margin was improved but a poor profile was observed (FIG. 3), and in Examples 10 and 15, the processing margin and resolution were improved but a poor profile was observed. In Example 20, the resolution and energy margin were deteriorated due to the addition of excessive organic acid.

In conclusion, when the organic acid additive represented by Chemical Formulas 1 to 4 is contained in an optimal amount, a chemically-amplified-type negative photoresist composition capable of improving a processing margin can be obtained.

All simple modifications or variations of the present invention may be easily performed by those skilled in the art, and fall within the scope of the present invention.

The invention claimed is:

1. A chemically-amplified-type negative photoresist composition, consisting of, based on a total weight of the composition, 0.1 to 1 wt % of an organic acid additive represented by Chemical Formula 3 below:

[Chemical Formula 3]

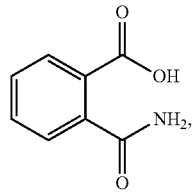

wherein the composition further includes, based on the total weight of the composition, 5 to 15 wt % of a 4-vinyl phenol monomer-derived phenol polymer resin, 1 to 2 wt % of a crosslinking agent, 0.1 to 0.4 wt % of a photoacid generator, 0.01 to 0.2 wt % of an acid diffusion inhibitor, and the remainder of a solvent.

2. The chemically-amplified-type negative photoresist composition of claim 1, wherein the phenol polymer resin is a resin derived from at least one monomer selected from among 4-hydroxy-3-methyl benzoic acid, 4-hydroxy-2-methyl benzoic acid, 5-hydroxy-2-methyl benzoic acid, 3,5-di-tert-butyl-4-hydroxy benzoic acid, 4-hydroxy-3,5-dimethyl benzoic acid, 4-hydroxy isophthalic acid, 2,4,6-hydroxy toluene, 2,4,6-trihydroxy benzoic acid monohydrate, 2,4,6-trihydroxy benzaldehyde, and 4-vinyl phenol, and the cresol polymer resin is a resin derived from at least one cresol selected from among o-cresol, p-cresol, m-cresol, epoxy o-cresol, epoxy p-cresol, and epoxy m-cresol.

3. The chemically-amplified-type negative photoresist composition of claim 1, wherein the crosslinking agent is at least one selected from the group consisting of tris(2,3-epoxypropyl)isocyanurate, trimethylolmethane triglycidyl ether, trimethylolpropane triglycidyl ether, hexamethylol melamine, trimethylolethane triglycidyl ether, hexamethoxymethyl melamine, hexamethoxyethyl melamine, tetramethylol 2,4-diamino-1,3,5-triazine, tetramethoxymethyl-2,4-diamino-1,3,5-triazine, tetramethylol glycoluril, tetramethoxymethyl glycoluril, tetramethoxyethyl glycoluril, tetramethylol urea, tetramethoxy methyl urea, tetramethoxy ethyl urea, and tetramethoxyethyl-2,4-diamino-1,3,5-triazine.

4. The chemically-amplified-type negative photoresist composition of claim 1, wherein the photoacid generator is at least one selected from the group consisting of triphenylsulfonium triflate, triphenylsulfonium antimonate, diphenyliodonium triflate, diphenyliodonium antimonate, methoxydiphenyliodonium triflate, di-t-butyldiphenyliodonium triflate, norbornene dicarboxyimide triflate, triphenylsulfonium nonaflate, diphenyliodonium nonaflate, methoxydiphenyliodonium nonaflate, di-t-butyldiphenyliodonium nonaflate, N-hydroxysuccinimide nonaflate, norbornene dicarboxyimide nonaflate, triphenylsulfonium perfluorooctane sulfonate, diphenyliodonium perfluorooctane sulfonate, methoxydiphenyliodonium perfluorooctane sulfonate, di-t-butyldiphenyliodonium perfluorooctane sulfonate, N-hydroxysuccinimide perfluorooctane sulfonate, and norbornene dicarboxyimide perfluorooctane sulfonate.

5. The chemically-amplified-type negative photoresist composition of claim 1, wherein the acid diffusion inhibitor is at least one selected from the group consisting of dimethylamine, diethylamine, trimethylamine, triethylamine, tributylamine, dimethanolamine, diethanolamine, trimethanolamine, triethanolamine, and tributanolamine.

* * * * *